United States Patent [19]

Kanzaki et al.

[11] Patent Number: 4,539,742
[45] Date of Patent: Sep. 10, 1985

[54] SEMICONDUCTOR DEVICE AND METHOD FOR MANUFACTURING THE SAME

[75] Inventors: Koichi Kanzaki, Kawasaki; Minoru Taguchi, Oomiya, both of Japan

[73] Assignee: Tokyo Shibaura Denki Kabushiki Kaisha, Kawasaki, Japan

[21] Appl. No.: 389,931

[22] Filed: Jun. 18, 1982

[30] Foreign Application Priority Data

Jun. 22, 1981 [JP] Japan ................. 56-96203
Jul. 24, 1981 [JP] Japan ................. 56-116082

[51] Int. Cl.³ .................. H01L 21/225; H01L 21/302
[52] U.S. Cl. ........................... 29/576 W; 29/576 B;
29/577 C; 29/578; 29/580; 148/1.5; 148/174;
148/175; 148/188
[58] Field of Search ............ 29/576 W, 576 B, 577 C,
29/578; 148/1.5, 188; 156/642; 357/15, 43, 55,
56

[56] References Cited

U.S. PATENT DOCUMENTS

| 4,220,961 | 9/1980 | Werner | 357/59 |
| 4,288,805 | 9/1981 | Depey | 357/44 |
| 4,338,622 | 7/1982 | Feth et al. | 357/92 |
| 4,377,903 | 3/1983 | Kanzaki et al. | 29/577 C |
| 4,407,059 | 10/1983 | Sasaki | 29/578 |
| 4,433,470 | 2/1984 | Kameyama et al. | 29/577 C |

FOREIGN PATENT DOCUMENTS

| 21403 | 7/1980 | European Pat. Off. | |
| 30147 | 6/1981 | European Pat. Off. | 29/577 C |
| 1571621 | 7/1981 | United Kingdom | |

OTHER PUBLICATIONS

Tang et al., *IEDM Dig. Tech. Papers*, "Sub-Nanosecond Self-Aligned I²L/MTL Circuits" 1979, (pp. 201–204).

Primary Examiner—Brian E. Hearn
Assistant Examiner—Hunter L. Auyang
Attorney, Agent, or Firm—Finnegan, Henderson, Farabow, Garrett & Dunner

[57] ABSTRACT

A semiconductor device wherein collector connecting wiring made of for example n+-type polycrystalline silicon layer is formed by an anisotropic etching which simultaneously engrave a groove in a semiconductor substrate. A collector layer is formed on a non-etched projection, while base contact hole is formed in the lower portion of the groove. Therefore, the base contact hole is not contacted with collector layer, thus preventing the flow of a leakage current and short-circuiting therebetween.

8 Claims, 21 Drawing Figures

SEMICONDUCTOR DEVICE AND METHOD FOR MANUFACTURING THE SAME

BACKGROUND OF THE INVENTION

The present invention relates to a semiconductor device and a method for manufacturing the same and, more particularly, to a semiconductor device having a bipolar integrated circuit with I²L elements and a method for manufacturing the same.

An I²L (Integrated Injection Logic) is a logic element which has a composite structure involving a vertical transistor (e.g., an npn transistor) of inverted structure and a lateral transistor (e.g., a pnp transistor) of complementary structure to that of the vertical transistor. In an I²L element of the structure as described above, the lateral transistor serves as an injector for injecting charge into the base of the vertical transistor which, in turn, serves as an inverter. For this reason, I²L elements have a small logic amplitude and are capable of operating at high speed with low power consumption. Since element isolation between the vertical and lateral transistors is unnecessary, I²L elements can achieve a high integration and are suitable for large scale integration. Furthermore, since an I²L involves the bipolar process technique, other bipolar circuits such as linear and ECL (Emitter Coupled Logic) circuits may be easily formed on the same chip, thus realizing a multi-functional integrated circuit.

Figure 1A:
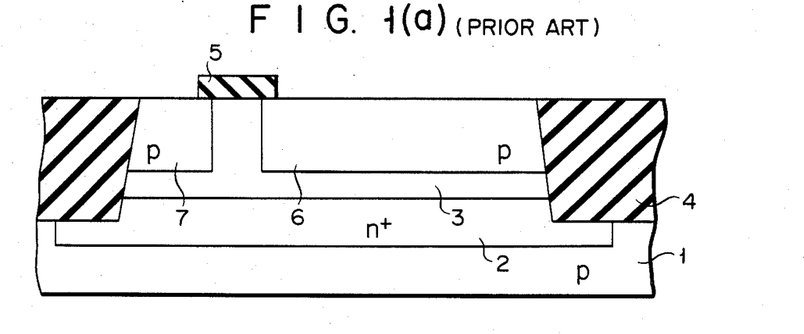
FIGS. 1A to 1C are sectional views showing the steps of manufacturing an I²L element according to a conventional method.
Figure 1B:
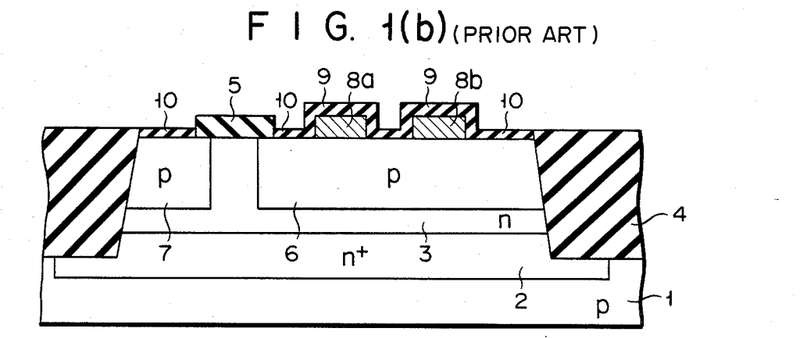
Figure 1C:
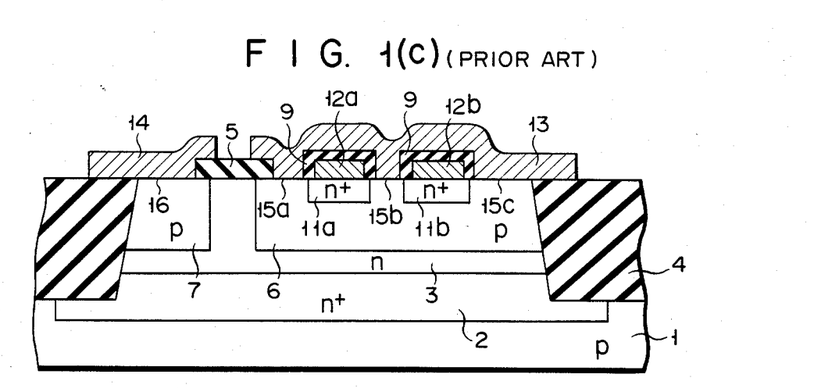

Various studies have been made to achieve higher operation speed of the I²L. It has been recently pointed out that it is important to achieve a short storing time, that is, the time required for a switching transistor to sink the minority carriers stored at an emitter or base region of a switching transistor of the next stage. This is described, for example, in IEEE Journal of Solid-State Circuits, Vol. SC-14. No. 2, April 1979, pp. 327 to 336. In order to eliminate storage of minority carriers, it is effective to optimize the concentration profile of the epitaxial semiconductor layer and the emitter region as well as to minimize the size of the region at which the minority carriers are stored. In view of this, it has been conventionally proposed to manufacture I²L elements by the method to be described below. According to this conventional method, referring to FIGS. 1A to 1C, an n+-type buried layer 2 is selectively formed in a p-type silicon substrate 1. After growing an n-type epitaxial layer 3 on the substrate 1, a thick field oxide film 4 for element isolation is formed by selective oxidation. After selectively forming a silicon oxide film 5 on the prospective element forming region by the CVD process or photolithography, boron is thermally diffused through the silicon oxide film 5 as a mask to form a p-type base region 6 and a p-type injector 7 (FIG. 1A). In the next step, an arsenic-doped polycrystalline silicon film (arsenic is an n-type impurity) is deposited over the entire surface of the structure. The arsenic-doped polycrystalline silicon film is selectively etched to form n+-type polycrystalline silicon patterns 8a and 8b on collector forming regions (FIG. 1B). Thermal oxidation under heating is performed to grow a thick thermal oxide film 9 around the polycrystalline patterns 8a and 8b and to grow a thin thermal oxide film 10 on the p-type injector 7. Arsenic doped in the polycrystalline silicon patterns 8a and 8b is diffused into the p-type base region 6 to form n+-type collector regions 11a and 11b. The thin thermal oxide film 10 is etched to provide the polycrystalline silicon patterns 8a and 8b as collector electrodes 12a and 12b. After an aluminum film is deposited over the entire surface of the structure, the aluminum film on the field oxide film 4 and the silicon oxide film 5 is patterned to form a base electrode 13 and an injector electrode 14. An integrated circuit including an I²L element is thus completed (FIG. 1C). Referring to FIGS. 1A to 1C, reference numerals 15a to 15c denote base contact holes, and reference numeral 16 denotes an injector contact hole.

In the conventional method for manufacturing an integrated circuit with an I²L described above, the entire surface of the substrate is oxidized utilizing differences between etching rates of the n+-type polycrystalline silicon patterns 8a and 8b and of the p-type base region 6 at a low temperature. Thereafter, only a thin portion above the p-type base region 6 can be etched. The base contact holes can be formed in self-alignment with the collector electrodes 12a and 12b, so that the base electrode 13 may be able to contact the base region 6 with a wider area. Moreover, the area of the base region 6 may be made smaller than the total area of the collector regions 11a and 11b. An I²L element manufactured is capable of high speed operation, and the ratio of the collector area to the base area ($S_C/S_B$) is increased. Therefore, the current amplification factor ($h_{FE}$) can be improved and higher integration can also be achieved. However, in the above I²L arrangement, the collector regions 11a and 11b and the base contact holes 15a and 15b come close to each other when the oxide film is etched too much, resulting in flow of a leakage current therebetween.

The following problems are presented in the elaborate patterning of the I²L structure. The n+-type polycrystalline silicon layer which is patterned as the n+-type polycrystalline silicon layers 8a and 8b and the p-type base region 6 contact each other. In order to selectively etch the n+-type polycrystalline silicon layer, the etching rates of the n+-type polycrystalline silicon layer and the p-type base region 6 are controlled so that the p-type base region 6 may not be etched when it is exposed after the n+-type polycrystalline silicon layer is selectively etched. In order to achieve selective etching of this type, an etchant of HF:HNO₃:CH₃COOH=1:3:8 is known. The etching rate of the n+-type polycrystalline silicon layer is at least ten times that of the p-type base region 6. However, the etchant of this type is not suitable for elaborate etching. If a pattern width of the n+-type polycrystalline silicon layer is 1 to 2 μm and if the etchant described above is used, the side surfaces of the n+-type polycrystalline silicon layer are etched by isotropic etching. Therefore, it is difficult to control precision of the n+-type polycrystalline silicon pattern. It is also difficult to maintain the etching rate constant on the entire surface of the wafer. Thus, elaborate patterning is limited. Meanwhile, a reactive ion etching (RIE) method is known in which patterning of 1 to 2 μm is effectively performed by anisotropic etching. However, at present, there is no RIE method which allows selective etching of the n+-type polycrystalline silicon layer and the p-type region. If the conventional RIE method is used to etch the n+-type polycrystalline silicon layer, the p-type base region is also etched. This method is not suitable for achieving the I²L arrangement shown in FIG. 1C.

SUMMARY OF THE INVENTION

The present invention has been developed in light of the above problems. Its object is to provide a bipolar semiconductor device with I²L elements and a method for manufacturing the same wherein base contact holes are formed in a self-aligned manner in a n⁺-type polycrystalline silicon layer which is used as a diffusion source of an I²L collector region or as a collector connecting wiring to minimize an outer base region of the I²L gate whereby elaborate patterning is performed and flow of a leakage current between the base and the collector of the I²L element is avoided, so that the packaging density and switching speed of the I²L element are improved.

According to one aspect of the present invention, there is provided a semiconductor device comprising:

a semiconductor substrate above which a semiconductor layer of a first conductivity type n⁺ is formed;

a projecting region which projects above the semiconductor layer and which has a conductive layer of the first conductivity type and a first insulating film formed on the conductive layer of the first conductivity type;

a second insulating film which is formed on side surfaces of the projecting region;

an impurity region of a second conductivity type p⁺ which is formed in a recessed region around the projecting region; and a wiring layer electrically connected to the impurity region of the second conductivity type;

wherein the impurity region of the second conductivity type is separated from the conductive layer of the first conductivity type layer through the side surfaces of said projecting region.

According to another aspect of the present invention, there is also provided a method for manufacturing a semiconductor device, comprising the steps of:

forming a first impurity region of a second conductivity type in a semiconductor layer of a first conductivity type which is formed above a semiconductor substrate;

selectively forming a conductive layer of the first conductivity type on the first impurity region of the second conductivity type, and a first insulating layer above the conductive layer of the first conductivity type;

forming a projecting region which has the conductive layer of the first conductivity type and the first insulating layer by anisotropic etching, using the first insulating layer as a mask, thereby defining a groove reaching at least the first impurity region of the second conductivity type;

forming a second insulating film to cover the entire surface and simultaneously forming a second impurity region of the second conductivity type on a bottom of the groove;

selectively etching the second insulating film to leave the second insulating film only on the side surfaces of the projecting region; and depositing a wiring layer electrically connected to the second impurity region of the second conductivity type on the bottom of the groove.

First, according to the present invention, in order to pattern a conductive layer such as the n⁺-type polycrystalline silicon layer which is used for the collector connecting wiring, anisotropic etching, such as the RIE method, is used to selectively etch the conductive layer. Furthermore, the groove which is formed in the semiconductor substrate extends beyond the conductive layer. As a result, a collector layer is formed on a non-etched projection, while the base contact hole is formed in the lower portion of the groove. Therefore, the base contact hole can not contact the collector layer, thus preventing the flow of a leakage current and short-circuiting therebetween. An I²L element manufactured according to the method of the present invention may have elaborate patterning which is a necessary factor for high packaging density.

Secondly, according to the present invention, a metal or metal silicide is used for a Schottky collector and a collector electrode wiring. The I²L element according to the present invention has a small logical amplitude compared to that of the conventional I²L. Thus, the collector electrode wiring has a low resistance, resulting in a high-speed I²L structure having low power consumption.

DETAILED DESCRIPTION OF THE PREFERRED EMBODIMENTS

An I²L element and a method of manufacturing the element according to one embodiment of the present invention will be described.

Figure 2A:
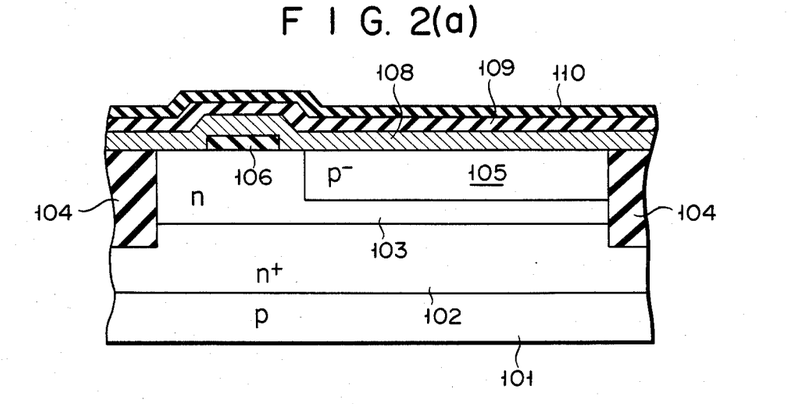
FIGS. 2A to 2F are sectional views showing the steps of an I²L manufacturing method according to one embodiment of the present invention.

Referring to FIG. 2A, antimony is selectively diffused into a p-type silicon substrate 101 to form an n⁺-type buried layer 102 therein. After growing an n-type silicon epitaxial layer 103 (semiconductor layer of a first conductivity type), a field oxide film 104 is formed around a prospective region in which an I²L gate should be formed. A p-type base region 105 (first impurity region of a second conductivity type) for intrinsic npn transistors is formed in part of the silicon epitaxial layer 103 by the ion-implantation or thermal diffusion method. A silicon oxide film 106 is formed to cover the base region of the pnp transistor by thermal oxidation, CVD film formation, or selective etching. Thereafter, an As-doped n⁺-type polycrystalline silicon film 108, a CVD-SiO₂ film 109, and a silicon nitride film 110 are sequentially formed.

Figure 2B:
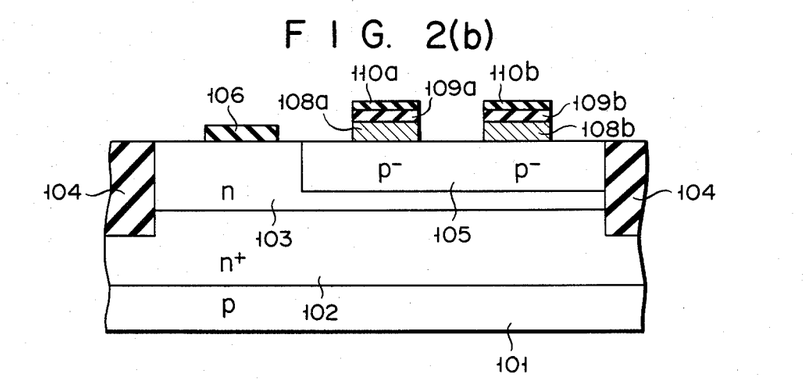

A resist pattern (not shown) is formed by photoetching on the silicon nitride film 110. The silicon nitride film 110 is then etched using the resist pattern as a mask to form silicon nitride film patterns 110a and 110b. The CVD-SiO₂ film 109 is etched using the silicon nitride film patterns 110a and 110b as a mask to form CVD-SiO₂ film patterns 109a and 109b. Exposed parts of the n⁺-type polycrystalline silicon film 108 are then etched using an etchant of HF:HNO₃:CH₃COOH=1:3:8, or etched by reactive ion etching (FIG. 2B). The n⁺-type polycrystalline silicon film 108 may comprise a bi-layered structure in which a layer of a metal such as tungsten or molybdenum, having a high melting point, or a layer of a metal silicide such as molybdenum silicide having a high melting point, is formed on the n+-type polycrystalline silicon layer.

Figure 2C:
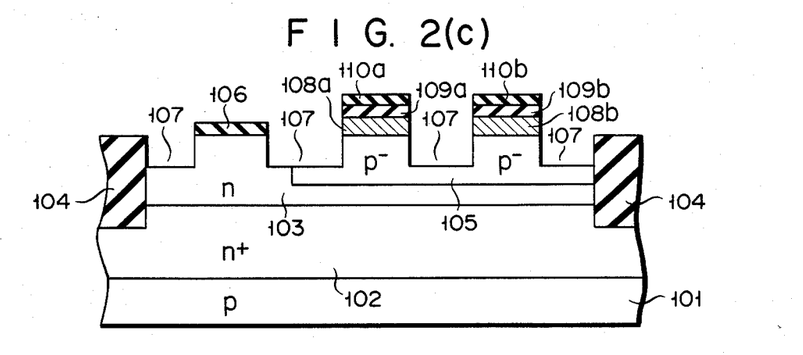

Exposed portions of the silicon substrate in FIG. 2B are then etched by anisotropic etching such as the RIE method to form grooves 107 (FIG. 2C). The grooves 107 may be formed to reach the p−-type base region 105 or beyond the p−-type base region 105. The bottom surfaces of these grooves 107 are generally formed deeper than the lower surface of the semiconductor layer 103 of the first conductivity type (collector regions 113a and 113b which are formed in the p−-type base region 105 by diffusion using the n+-type polycrystalline silicon layer 108 as the diffusion source will be described later). More particularly, the depth of the grooves 107 relative to the silicon substrate is often preferably within a range of 0.15 to 0.7 μm. If the grooves 107 are formed to a depth shallower than the above range, the n-type impurity in the n+-type polycrystalline silicon layer is diffused transversely, resulting in the flow of a leakage current between the base and the collector. However, if the grooves 107 are formed deeper than the above range, a p+-type base layer 112 is far separated from a p−-type base layer 105, degrading the high speed operation of the I²L, as is apparent from FIG. 2E. This also applies to the bi-layered structure in which molybdenum silicide is deposited on the n+-type polycrystalline silicon patterns 108a and 108b. With this arrangement, the wiring resistance is advantageously reduced.

Figure 2D:
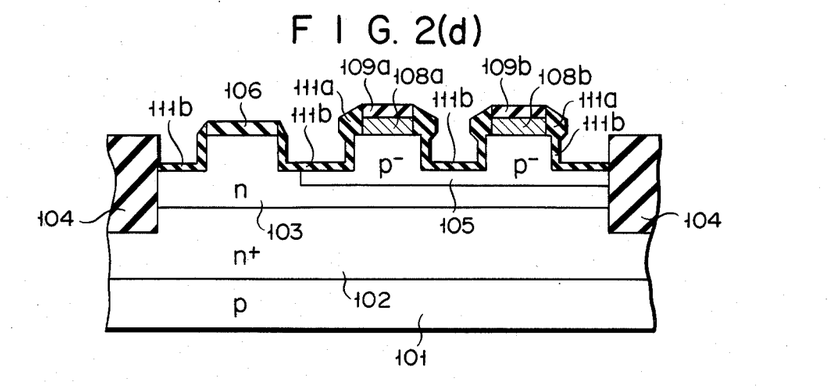

The wafer thus obtained is annealed in an atmosphere of low-temperature steam or in a wet atmosphere of 700° to 900° C. Since the oxidation rate of the n+-type polycrystalline silicon patterns 108a and 108b is 4 to 10 times higher than that of the n-type silicon epitaxial layer 103 or the p−-type base region 105, a thick thermal oxide film 111a is formed on the exposed side surfaces of the n+-type polycrystalline silicon patterns 108a and 108b, and a thin thermal oxide film 111b is formed on the exposed surfaces of the n-type silicon epitaxial layer 103 and on the exposed side surfaces of the p−-type base region 105, as shown in FIG. 2D. Also, the sides of the CVD SiO₂ film patterns 109a and 109b, are, like the film patterns 108a and 108b, changed to thermal oxide films 111a, whereupon the films are narrowed as shown in FIGS. 2(c) and 2(d). After this annealing process, silicon nitride films 110 are selectively dry-etched by a conventional etchant such as Freon gas, O₂ and N₂.

Figure 2E:
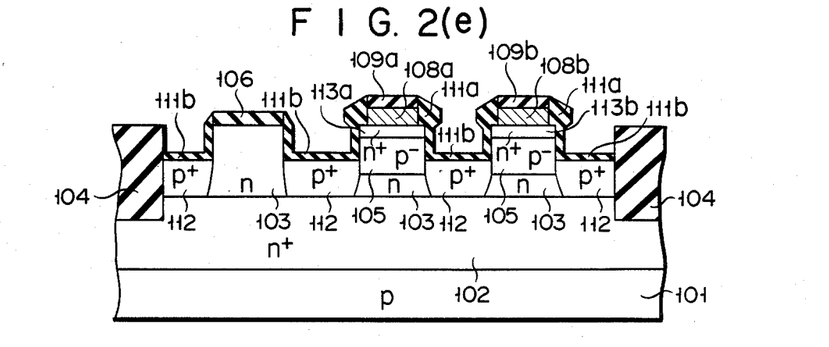

As shown in FIG. 2E, a p-type impurity such as boron is ion-implanted through the thin thermal oxide film 111b. Thereafter, the wafer is annealed to form an external p+-type base layer 112. Simultaneously, arsenic in the n+-type polycrystalline silicon patterns 108a and 108b is diffused into the n+-type polycrystalline silicon layers 103 to form the n+-type collector regions 113a and 113b.

Figure 2F:
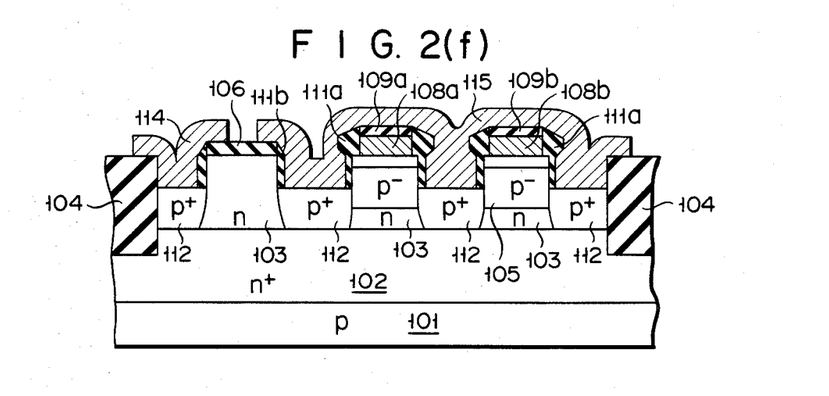

As shown in FIG. 2F, part of the thin thermal oxide film 111b which is formed on the bottom surface of the grooves 107 is etched by anisotropic etching in a self-aligned manner to form contact holes. An Al-Si alloy metal layer is deposited to cover the entire surface and is patterned to form an injector electrode 114 and a base electrode 115 which connects the base contact holes. Thus, the final I²L element is prepared as shown in FIG. 2F.

As is apparent from the above embodiment, the n+-type collector layers or n+-type polycrystalline silicon patterns 108a and 108b of the vertical transistors is formed in projections separated by the grooves 107. Therefore, the n+-type collector layers may not extend transversely. Furthermore, these layers may not be exposed to the self-aligned base contact holes at the bottom of the grooves 107. Flow of a leakage current and short-circuiting between the base and the collector of the I²L are thus prevented. Further, anisotropic etching such as the RIE method is used to control the patterning size of the n+-type collector layers. Thus, a bipolar integrated circuit having high-speed I²L elements with a high packing density is obtained.

In the above embodiment, arsenic-doped n+-type polycrystalline silicon is used. However, polycrystalline silicon doped with phosphorus or other impurities may also be used.

Figure 3:
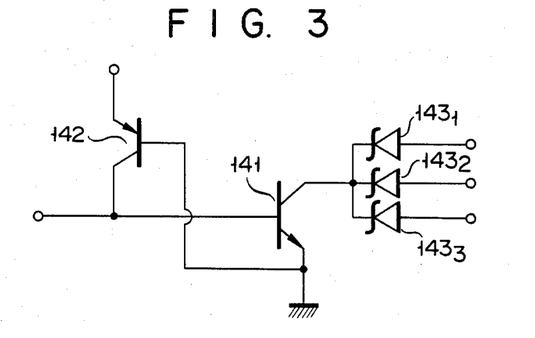
FIG. 3 is a circuit diagram of a Schottky collector I²L gate circuit.

An I²L gate structure according to another embodiment of the present invention will be described. FIG. 3 shows an I²L gate circuit having a Schottky collector. Reference numeral 141 denotes a vertical npn transistor of an inverted structure; 142, a lateral pnp transistor of a complementary type to that of the vertical npn transistor 141; and 143₁, 143₂ and 143₃, Schottky barrier diodes connected to the collector of the lateral pnp transistor 142, respectively.

The detailed arrangement of the I²L gate circuit and its manufacturing method according to a second embodiment of the present invention will be described with reference to FIGS. 4A to 4F.

Figure 4A:
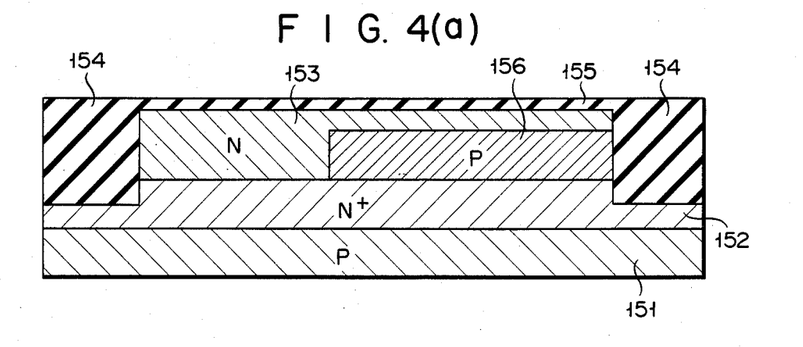
FIGS. 4A to 4F are sectional views showing the steps of an I²L manufacturing method according to a second embodiment of the present invention.
Figure 4B:
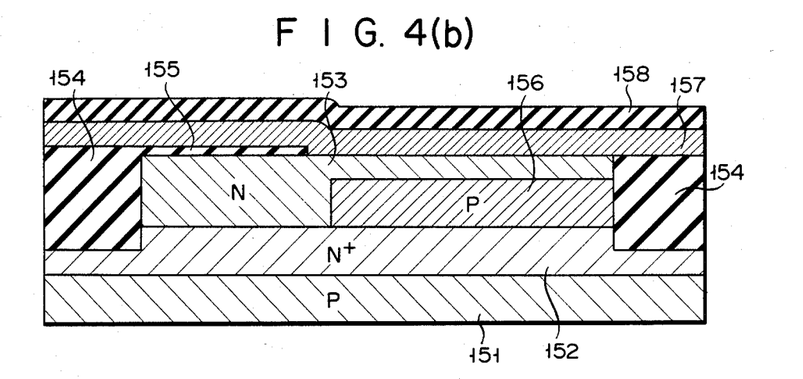
Figure 4C:
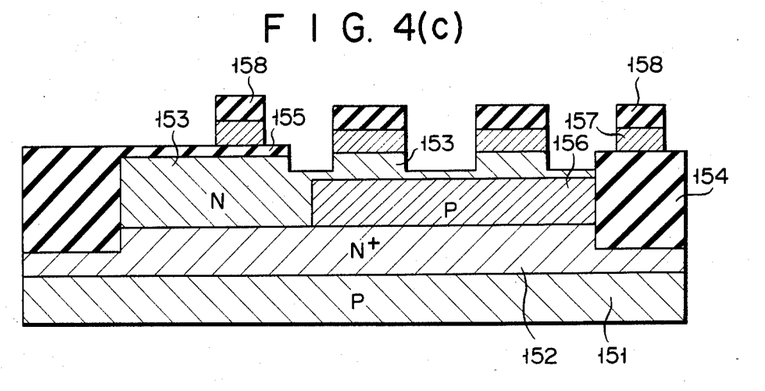
Figure 4D:
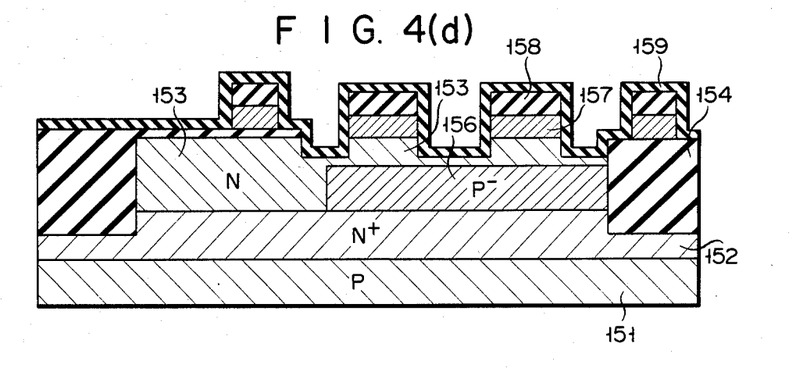
Figure 4E:
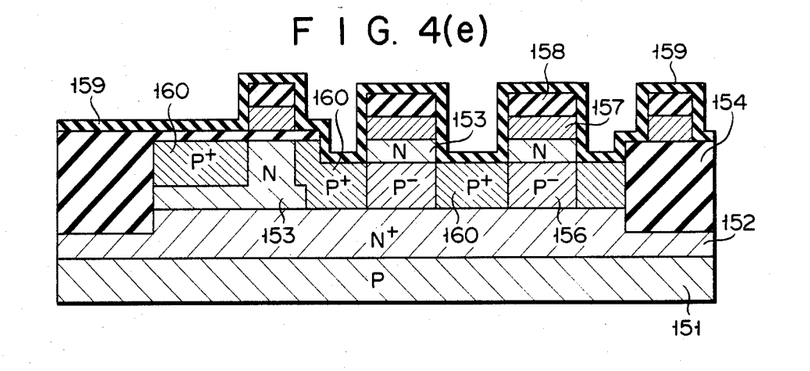
Figure 4F:
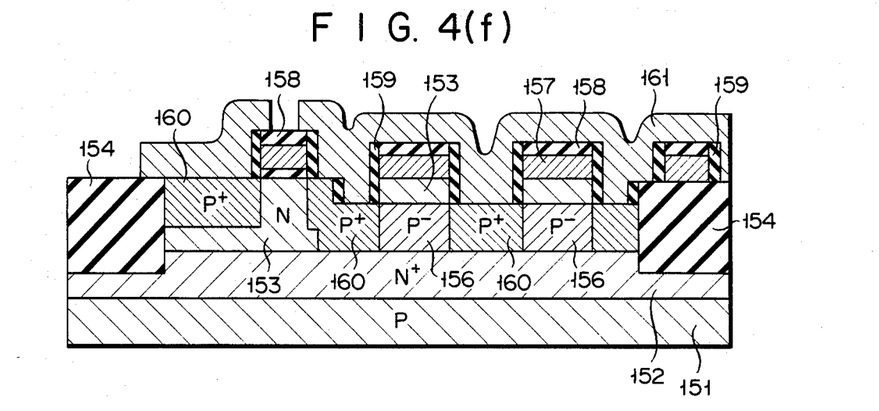

Referring to FIG. 4A, an n+-type impurity layer 152 and an n-type epitaxial layer 153 are formed on a p-type silicon substrate 151 and selective oxidation is performed to form a field oxide film 154. After a relatively thin SiO₂ film 155 is formed to cover the entire surface, a p−-type region 156 of an impurity concentration defined as an internal base layer of the I²L is formed in the n-type epitaxial layer 153. The p−-type region 156 can be formed utilizing accelerated ion implantation of boron. As shown in FIG. 4B, after part of the thin SiO₂ film 155 is etched, a Schottky metal layer 157 and a CVD-SiO₂ film 158 (formed at a low temperature so as not to alloy the metals by the CVD method) are sequentially formed. As shown in FIG. 4C, the Schottky metal layer 157 and the CVD-SiO₂ film 158 are selectively etched using a photoresist film as a mask so that grooves reach part of the epitaxial layer 153. Thus, projecting regions are formed. The RIE method is preferably used to etch the Schottky metal layer 157 and the CVD-SiO₂ film 158 in a substantially vertical direction. As shown in FIG. 4D, a CVD-SiN film 159 formed at a low temperature so as not to alloy the metal by the CVD method is formed to cover the entire surface. Thereafter, a relatively high p-type impurity such as boron is ion-implanted using the CVD-SiO₂ film as a mask. The p-type impurity is then activated upon radiation of laser beams. At this time, the metal has a high reflection coefficient, so the Schottky metal layer 157 is not heated to a high temperature, while the silicon is heated to a high temperature. As shown in FIG. 4E, only p+-type external base regins 160 are activated. Thereafter, as shown in FIG. 4F, part of the CVD-SiN film 159 is etched by the RIE method such that the CVD-Sin film 159 remains only on the side surfaces of projections comprising the epitaxial layer 153, the Schottky metal layer 157 and the CVD-SiO₂ film 158. Then, a metal is deposited to form metal wiring 161. The metal wiring 161 is then sintered to prepare the I²L.

The I²L prepared by a method described above has the following effects.

(1) Since the collector of the npn transistor 141 forms a Schottky clamp, the logical amplitude is smaller than that in the conventional arrangement in which the n+-type polycrystalline silicon wiring is deposited on the n+-type collector layer. The I²L element according to the present invention has a small parasitic capacitance. Therefore, a high-speed I²L with a high packaging density is obtained. Furthermore, since the collector wiring comprises a metal, the wiring resistance is substantially negligible.

(2) Since the p+-type external base region 160 is sufficiently vertically spaced apart from the Schottky metal layer 157, the dielectric strength between the external base and the collector is degraded.

(3) Since the metal for collector wiring can be used with another low-resistant wiring material in the manufacturing process, a bi-layered wiring can be formed in practice.

With the I²L of this type, a high performance device can be readily manufactured. Note that the Schottky metal may comprise tungsten (W), silver (Ag), aluminum (AL), gold (Au), Pt plutinum), or the like. The silicide film may comprise a silicide of the metals described above.

Figure 5A:
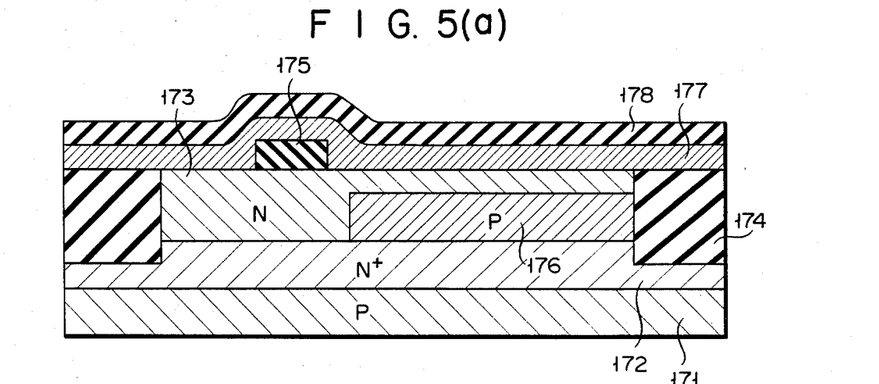
FIGS. 5A to 5E are sectional views showing the steps of an I²L manufacturing method according to a third embodiment of the present invention.
Figure 5B:
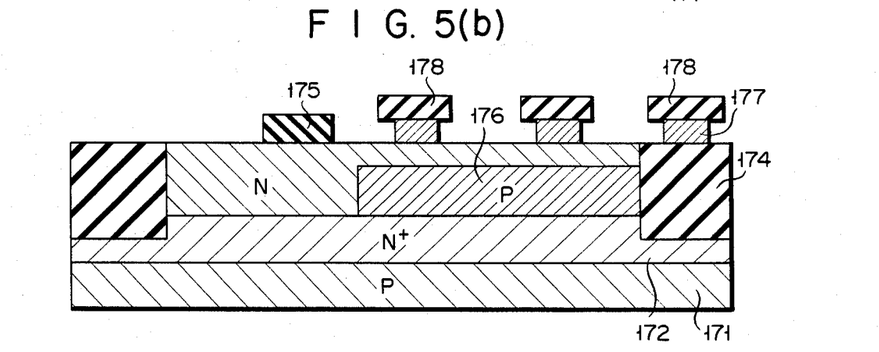

An I²L according to a third embodiment of the present invention will be described with reference to FIGS. 5A to 5E. Referring to FIG. 5A, an n+-type impurity region 172 and an n-type epitaxial layer 173 are formed on a p-type silicon substrate 171 in the same manner as in FIGS. 4A to 4F. Field oxide films 174 are then formed by selective oxidation. After a relatively thin SiO₂ film 175 is formed, a p⁻-type region 176 is formed in the n-type epitaxial layer 173. A Schottky metal layer 177 and a CVD-SiO₂ film 178 formed by the CVD method at a low temperature are sequentially formed to cover the entire surface. As shown in FIG. 5B, The Schottky metal layer 177 and the CVD-SiO₂ film 178 are selectively etched using a photoresist film as a mask. If the Schottky metal layer 177 of aluminum, for example, is etched by an etchant of a phosphoric acid type, the CVD-SiO₂ film 178 overhangs the patterned Schottky metal layer.

Figure 5C:
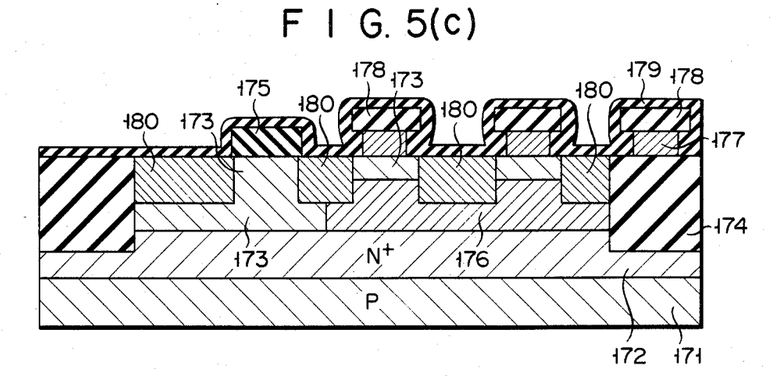
Figure 5D:
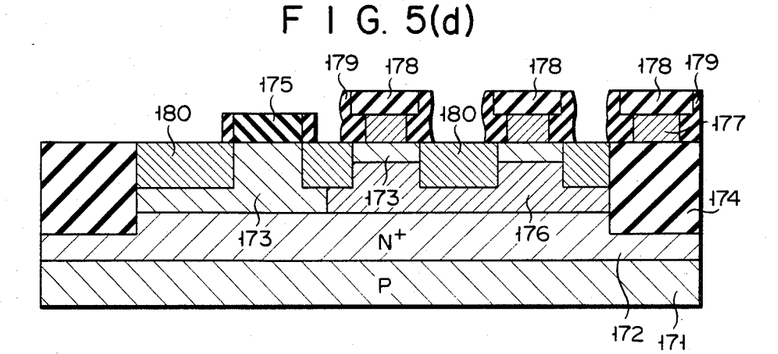
Figure 5E:
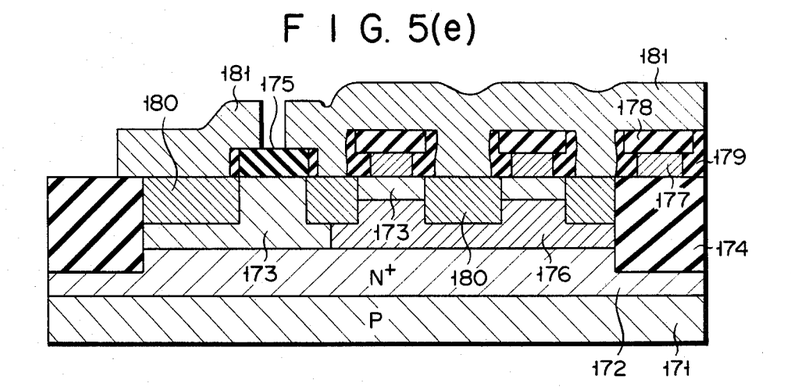

As shown in FIG. 5C, a p-type impurity such as boron is ion-implanted to a relatively high concentration to form external base regions 180, using the oxide films 174, 175 and as a mask. After a CVD-SiN film 179 formed at a low temperature is deposited, laser beams are radiated on the doped layer which is then activated to convert base regions of 180 into extended p+-type regions. Thereafter, as shown in FIG. 5D, the CVD-SiN film 179 is selectively etched by the RIE method to the extent that the CVD-SiN film 179 remains only on the side surfaces of the projections comprising the Schottky metal layer 177 and the CVD-SiO₂ film 178. A metal is deposited to form metal wiring 181 and to electrically connect the p+-type base regions 180, as shown in FIG. 5E. Finally, the metal wiring 181 is sintered to prepare the I²L.

This I²L has the same effects as in the I²L shown in FIGS. 4A to 4F.

According to the present invention, a high-speed I²L with low power consumption can be manufactured.

In the above embodiments, a bipolar I²L element is described. However, the present invention is not limited to this, but may be extended to field effect transistors.

What is claimed is:

1. A method for manufacturing a semiconductor device, comprising the steps of:
    (a) forming a first impurity region of a second conductivity type in a semiconductor layer of a first conductivity type which is formed above a semiconductor substrate;
    (b) selectively forming a conductive film of said first conductivity type on a portion of said first impurity region, said film being covered by a first insulating layer;
    (c) forming a groove by anistropically etching portions of said first impurity region using said first insulating layer as a mask, thereby defining a projecting region supporting said conductive film and said first insulating layer and having side surfaces extending below said conductive film;
    (d) forming a second insulating layer covering the grooved surface formed in step (c);
    (e) forming a second impurity region of said second conductivity type at the bottom of said groove;
    (f) selectively etching said second insulating layer to leave said second insulating layer on the side surfaces of said groove defining said projecting region; and
    (g) depositing a wiring layer electrically connected to said second impurity region.

2. The method according to claim 1 wherein said conductive film has a Schottky junction formed thereon.

3. The method according to claim 1 wherein an impurity of said second conductivity type is ion-implanted through said second insulating layer to form said second impurity region in step (e).

4. The method according to claim 1 wherein said conductive film formed in step (b) comprises a polycrystalline silicon layer doped with an impurity of said first conductivity type, and wherein said method further comprises the step of forming a doped region of said first conductivity type in said first impurity region formed in step (a) using said polycrystalline silicon layer as a diffusion source, at the same time said second impurity region is formed in step (e).

5. The method according to claim 4 wherein the bottom surface of said groove is below the lower surface of said doped region formed by diffusin of an impurity from said polycrystalline silicon layer.

6. The method according to claim 5 wherein the depth of said groove is approximately 0.15 to 0.7 μm.

7. The method according to claim 1 wherein said first conductivity type is an n conductivity type, and said second conductivity type is a p conductivity type.

8. The method according to claim 1 wherein said semiconductor layer of said first conductivity type constitutes an emitter section of an npn transistor of an I²L gate, said semiconductor layer of said second conductivity type constitutes a base section of said npn transistor and an emitter section of a pnp transistor of said I²L gate, and said conductive film of said first conductivity type constitutes a collector section of said npn transistor.

* * * * *